United States Patent
Tominaga et al.

(10) Patent No.: US 11,375,632 B2
(45) Date of Patent: Jun. 28, 2022

(54) DISSIMILAR MATERIAL JOINT AND HOUSING FOR ACCOMMODATING ELECTRONIC COMPONENTS

(71) Applicant: MITSUI CHEMICALS, INC., Tokyo (JP)

(72) Inventors: Takahiro Tominaga, Ichihara (JP); Kazuki Kimura, Sodegaura (JP); Masaki Misumi, Yokohama (JP); Nobuyoshi Shinbori, Ichihara (JP)

(73) Assignee: MITSUI CHEMICALS, INC., Tokyo (JP)

(*) Notice: Subject to any disclaimer, the term of this patent is extended or adjusted under 35 U.S.C. 154(b) by 0 days.

(21) Appl. No.: 16/961,782

(22) PCT Filed: Feb. 26, 2019

(86) PCT No.: PCT/JP2019/007209
§ 371 (c)(1),
(2) Date: Jul. 13, 2020

(87) PCT Pub. No.: WO2019/164008
PCT Pub. Date: Aug. 29, 2019

(65) Prior Publication Data
US 2021/0068285 A1 Mar. 4, 2021

(30) Foreign Application Priority Data
Feb. 26, 2018 (JP) .............................. JP2018-031889

(51) Int. Cl.
*H05K 5/04* (2006.01)
*H05K 5/02* (2006.01)
*H05K 5/00* (2006.01)

(52) U.S. Cl.
CPC ............ *H05K 5/04* (2013.01); *H05K 5/0013* (2013.01); *H05K 5/0217* (2013.01)

(58) Field of Classification Search
CPC .............................. H05K 5/04; H05K 5/0217
See application file for complete search history.

(56) References Cited

U.S. PATENT DOCUMENTS

| 7,640,646 B2 | 1/2010 | Naritomi et al. |
| 10,827,658 B2 * | 11/2020 | Naito ................... H05K 5/0013 |
| 2002/0160145 A1 | 10/2002 | Bauhoff |
| 2004/0062943 A1 | 4/2004 | Naritomi et al. |

(Continued)

FOREIGN PATENT DOCUMENTS

| EP | 1 459 882 A1 | 9/2004 |
| JP | S53-086062 U | 7/1978 |

(Continued)

OTHER PUBLICATIONS

International Searching Authority, "International Search Report," issued in connection with International Patent Application No. PCT/JP2019/007209, dated Apr. 9, 2019.

(Continued)

*Primary Examiner* — Hung V Ngo
(74) *Attorney, Agent, or Firm* — Foley & Lardner LLP

(57) ABSTRACT

A dissimilar material joint including a joined portion between a resin rib and a metal base, in which the metal base forms a protrusion protruding inside of the resin rib on at least a part of the joined portion.

12 Claims, 6 Drawing Sheets

(56) References Cited

U.S. PATENT DOCUMENTS

| | | | |
|---|---|---|---|
| 2008/0127479 | A1 | 6/2008 | Naritomi et al. |
| 2015/0029691 | A1 | 1/2015 | Yang |
| 2016/0037690 | A1 | 2/2016 | Nomizo et al. |
| 2016/0207236 | A1 | 7/2016 | Tsubota et al. |
| 2019/0386360 | A1* | 12/2019 | Lee .......................... C08J 3/203 |
| 2020/0198195 | A1* | 6/2020 | Ren ....................... G06F 1/1656 |

FOREIGN PATENT DOCUMENTS

| | | |
|---|---|---|
| JP | H06-29684 A | 2/1994 |
| JP | H11-298158 A | 10/1999 |
| JP | 2012-045920 A | 3/2012 |
| JP | 2014-014997 A | 1/2014 |
| JP | 2014-091263 A | 5/2014 |
| JP | 2016-032048 A | 3/2016 |
| JP | 2017-001317 A | 1/2017 |
| WO | WO-02/068257 A1 | 9/2002 |

OTHER PUBLICATIONS

International Searching Authority, "Written Opinion," issued in connection with International Patent Application No. PCT/JP2019/007209, dated Apr. 9, 2019.

Office Action dated Aug. 31, 2021 issued in a corresponding Japanese Patent Application No. 2020-501097.

* cited by examiner

DISSIMILAR MATERIAL JOINT AND HOUSING FOR ACCOMMODATING ELECTRONIC COMPONENTS

CROSS-REFERENCE TO RELATED APPLICATIONS

The present application claims priority under 37 U.S.C. § 371 to International Patent Application No. PCT/JP2019/007209, filed Feb. 26, 2019, which claims priority to and the benefit of Japanese Patent Application No. 2018-031889, filed on Feb. 26, 2018. The contents of these applications are hereby incorporated by reference in their entireties.

TECHNICAL FIELD

The present invention relates to a dissimilar material joint and a housing for accommodating electronic components.

BACKGROUND ART

Many proposals have been made on a lightweight shielded housing obtained by combining a metal plate and a synthetic resin as a housing for accommodating electronic components in the related art (for example, Patent Documents 1 and 2). However, in this shielded case, a difference in a coefficient of thermal expansion between the metal plate and the resin or molding shrinkage thereof caused peeling, warpage, deformation, or the like after molding, and this had a negative effect on internal electronic components and the like.

There is a strong need for weight reduction and compactness of the housing itself, especially in the field of housing for accommodating electronic components for vehicles. In parallel with this, in order to effectively cope with an increase in the number of types of electronic components accommodated in the housing or an increasing trend in the number of components, a method for reducing a thickness of metal parts constituting the housing to reduce the weight as much as possible, and solving a decrease in housing hardness or deformation of the housing by the amount of the reduced thickness, by increasing a bonding amount of a reinforcing rib formed of resin may also be considered. As a result of trials of such a method, the inventors have found that, especially in a case where the thickness of the metal plate is less than 0.5 mm, a total area of the joint to an inner surface of the housing and a total area of the joint to an outer surface of the housing significantly different from each other, there is a problem that significant warpage deformation occurs in the housing.

RELATED DOCUMENT

Patent Document

[Patent Document 1] Japanese Unexamined Patent Publication No. 6-29684
[Patent Document 2] Japanese Unexamined Patent Publication No. 2014-14997

SUMMARY OF THE INVENTION

Technical Problem

The invention is to provide a dissimilar material joint to reduce the aforementioned problem, that is, deformation of the thermoplastic resin after injection molding due to shrinkage and the like, or peeling of the resin rib from the metal base, and having excellent strength and capable of preventing deformation, even after usage for a long period of time, in the dissimilar material joint in which a resin rib is joined to a thin metal base for reinforcement.

Solution to Problem

The inventors have conducted intensive studies to achieve the above object, and have reached the invention. That is, the gist of the invention is as follows.

[1]
A dissimilar material joint including a joined portion between a resin rib and a metal base,
in which the metal base forms a protrusion protruding inside of the resin rib on at least a part of the joined portion.

[2]
The dissimilar material joint according to [1], in which the protrusion has a groove structure formed so as to extend continuously in a longitudinal direction of the resin rib.

[3]
The dissimilar material joint according to [2], in which the resin rib is joined to one surface of the metal base, and the groove structure includes a single groove having an inverted V-shaped cross section.

[4]
The dissimilar material joint according to [2] or [3], in which the resin ribs are joined to both surfaces of the metal base so as to face each other.

[5] The dissimilar material joint according to any one of [2] to [4], in which the groove structure includes two grooves parallel to each other and having an inverted V-shaped cross section and a V-shaped cross section.

[6]
The dissimilar material joint according to any one of [1] to [5], in which the joined portion is formed by dissimilar material joining in which a resin intrudes into fine ruggedness shape of a metal surface formed at least in the joined portion.

[7]
The dissimilar material joint according to any one of [1] to [6], in which a metal constituting the metal base is one or two or more selected from iron, stainless steel, an aluminum alloy, a magnesium alloy, and a copper alloy.

[8]
The dissimilar material joint according to any one of [1] to [7], in which the resin rib is formed of a thermoplastic resin composition containing a thermoplastic resin and a filler.

[9]
The dissimilar material joint according to [8], in which the resin rib is formed by injection molding of the thermoplastic resin composition onto the metal base.

[10]
The dissimilar material joint according to any one of [1] to [9],
in which the dissimilar material joint has a developed planar structure in which a housing for accommodating electronic components is developed.

[11]
A housing for accommodating electronic components including the dissimilar material joint according to any one of [1] to [10].

Advantageous Effects of Invention

There is provide a dissimilar material joint to reduce deformation of the thermoplastic resin after injection molding due to shrinkage and the like, or peeling of the resin rib from the metal base, and having excellent strength and capable of preventing deformation, even after usage for a long period of time, in the dissimilar material joint in which a resin rib is joined to a thin metal base for reinforcement.

BRIEF DESCRIPTION OF THE DRAWINGS

The above-described object and other objects, features, and advantages will be further clarified with reference to the preferred embodiments described below and the following accompanying drawings.

DESCRIPTION OF EMBODIMENTS

Figure 1A:
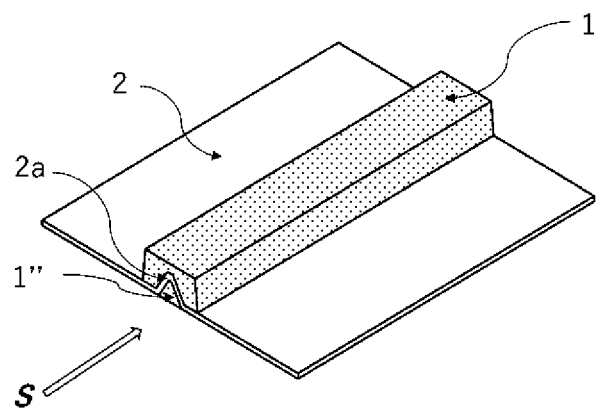
FIG. 1A is a perspective view of a dissimilar material joint in which a resin rib is joined to one surface of a metal base on which an inverted V-shaped groove is formed and the resin is also embedded in a groove channel.

Hereinafter, embodiments of the invention will be described with reference to the drawings. In all the drawings, the common reference numerals are used for the same components, and the description thereof will not be repeated. In addition, the drawings are schematic views and do not match the actual dimensional ratios. "to" between numbers in the text indicates the expression, equal to or more than a number and equal to or less than a number, unless otherwise specified.

<Dissimilar Material Joint>

First, a dissimilar material joint according to the embodiment will be described with reference to the drawings.

The dissimilar material joint of the embodiment has a joined portion between a resin rib 1 (1') and a metal base 2, and the metal base 2 forms a protrusion protruding inside of the resin rib 1 (1') on at least a part of the joined portion. Due to the presence of the protrusion, a contact area between the resin rib 1 (1') and the metal base 2 can be increased, and the resin rib 1 (1') and the metal base 2 can be strongly bonded to each other. Accordingly, in a case where the deformation of the dissimilar material joint due to shrinkage or the like of the thermoplastic resin after the injection molding occurs or an external force is applied, the amount of displacement is small, and the peeling of the resin rib 1 (1') from the metal base 2 can be reduced. Therefore, the dissimilar material joint has excellent strength. Furthermore, even after the usage for a long period of time, the deformation of the dissimilar material joint can be prevented.

A shape of the protrusion may be a conical or hemispherical protrusion structure, or maybe a groove structure that can be seen as a continuous body of these protrusion structures. It is preferable that the protrusion has a groove structure from viewpoints of an excellent effect of preventing warpage at the joined portion and an effect of reducing deformation due to an external force, and ease of providing a protrusion structure to a metal surface.

The conical or hemispherical protrusion can be formed by, for example, a method using embossing a metal plate or a turret punch press method. In the groove structure applied to the metal plate, for example, the forming by press molding is easily performed, and thus the groove structure is preferably used for the protrusion.

In a case where the protrusion formed on the metal base 2 has a conical or hemispherical shape, a maximum diameter varies depending on a thickness of the metal base. In a case where the thickness of the metal base is in a range of 0.2 mm to 1 mm, the maximum diameter is normally 0.1 mm to 10 mm, preferably approximately 0.5 mm to 5 mm, and more preferably approximately 1 mm to 3 mm. In a case where the diameter is in a range of 0.1 mm to 10 mm, occurrence of warpage of the dissimilar material joint and the amount of displacement due to an external force can be effectively prevented.

Figure 4A:
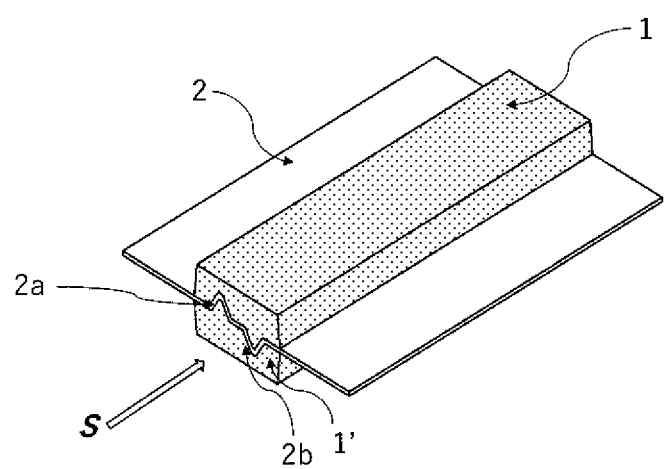
FIG. 4A is a perspective view of a dissimilar material joint in which resin ribs are joined to both surfaces of a metal base on which an inverted V-shaped groove and a V-shaped groove are formed to be adjacent to each other, to face each other.
Figure 4B:
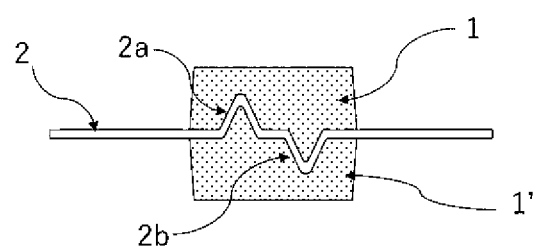
FIG. 4B is a cross-sectional view thereof seen in an S direction.
Figure 5A:
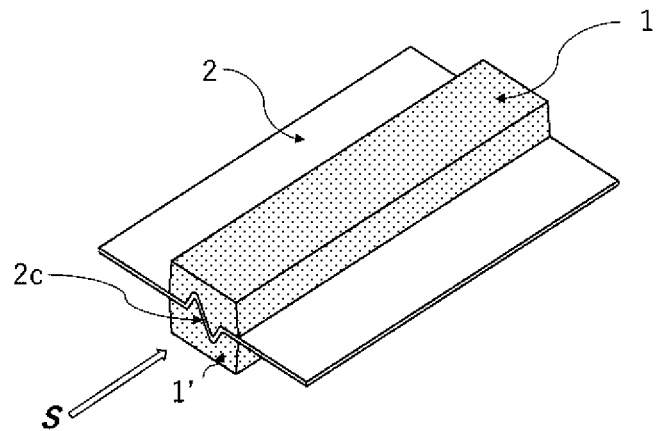
FIG. 5A is a perspective view of a dissimilar material joint in which resin ribs are joined to both surfaces of a metal base on which an S-shaped groove is formed, to each other.
Figure 5B:
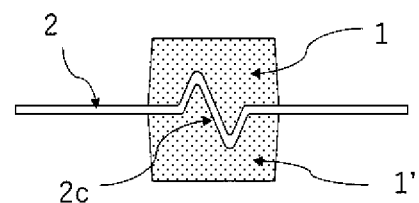
FIG. 5B is a cross-sectional view thereof seen in an S direction.

The groove structure which is preferably a protrusion formed on the metal base 2 is formed so as to extend continuously in the longitudinal direction of the resin rib 1. In this case, the contact area between the resin rib 1 (1') and the metal base 2 via the protrusion can be increased, and the resin rib 1 (1') and the metal base 2 are strongly joined to each other. In the groove structure, an inverted V-shaped groove 2a having a cross section shown in FIGS. 1 and 2 may be provided, two inverted V-shaped grooves 2a parallel to each other as shown in FIG. 3 may be formed adjacent to each other at a fixed distance, the inverted V-shaped groove 2a and a V-shaped groove 2b having a cross section shown in FIG. 4 may be formed adjacent to each other at a fixed distance, and a groove shape (a groove 2c having an S-shaped cross section) in which the inverted V-shaped groove 2a and the V-shaped groove 2b having a cross section shown in FIG. 5 are continuously formed without any distance may be provided.

In the embodiment, the resin rib may be formed only on one side of the metal base (for example, in examples shown in FIG. 4 or FIG. 5, only one of the resin rib 1 and the resin rib 1' may be provided), or the resin ribs may be formed on both surfaces of the metal base so as to face each other (for example, in example shown in FIG. 1, FIG. 2, or FIG. 3, the other resin rib may be provided on a side opposite to the surface provided with the resin rib 1), but from a viewpoint of preventing deformation, the resin ribs are preferably disposed on both surfaces of the metal base to face each other. In the embodiment, "facing" refers to expression that at least a part of the resin rib formed on one surface of the metal base and at least a part of the resin rib formed on the other surface thereof face each other in a direction perpendicular to the surface of the metal base.

Figure 1B:
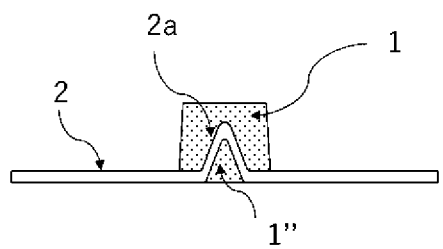
FIG. 1B is a cross-sectional view thereof seen in an S direction.
Figure 2A:
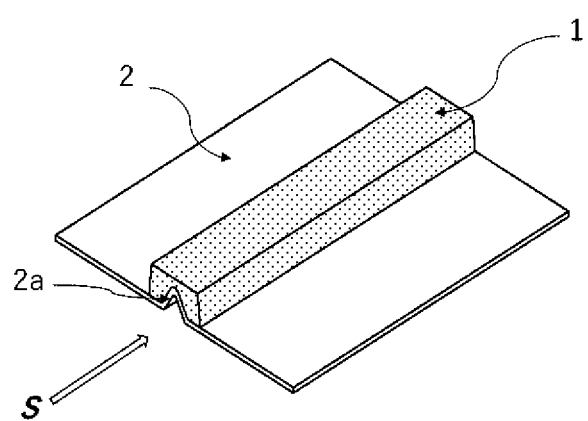
FIG. 2A is a perspective view of a dissimilar material joint in which a resin rib is joined to only one surface of a metal base on which an inverted V-shaped groove is formed.
Figure 2B:
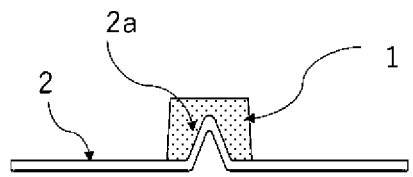
FIG. 2B is a cross-sectional view thereof seen in an S direction.
Figure 3:
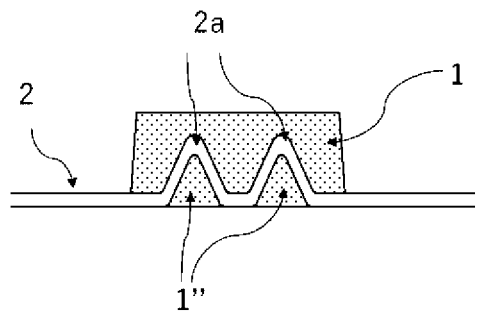
FIG. 3 is a cross-sectional view of a dissimilar material joint in which a resin rib is joined to one surface of a metal base on which two inverted V-shaped grooves parallel to each other are formed, and a resin is also embedded in two groove channels.

In the embodiment, generally, in a case where the resin rib 1 is mounted on and joined to only one surface of the metal base, the metal base 2 in which one or two or more of a plurality of inverted V-shaped grooves are formed on a resin rib joining surface, as shown in the schematic view shown in FIGS. 1, 2 and 3, is preferably used. On the other hand, in a case where the resin rib 1 and the resin rib 1' are mounted and joined to both surfaces of the metal base 1 to face each other, the metal base 2 in which both of the inverted V-shaped groove and the V-shaped groove are formed on joining surfaces of the resin rib 1 and the resin rib 1', as shown in the schematic view shown in FIGS. 4 and 5, is preferably used.

In the invention, the V-shaped cross section is not limited to a strict V-shape (cross section having an isosceles triangle), but includes all of cross sections such as a U-shape, a hemispherical shape, or a polygon (tetragon, pentagon, or the like) having an obtuse apex. A metal base having such a cross-sectional shape has a large second moment of area per unit weight and can be prepared by well-known metal working. A typical method is a bending process using a press machine, and specific examples thereof include die bending (protruding bending, V bending), bending (holding bending, L bending), and reverse holding bending (U bending). The metal base 2 according to the embodiment can be obtained by selecting one of these methods or by appropriately combining them in some cases.

The structure of the protrusion is not limited to the examples shown in FIGS. 1 to 5. In another example, a plurality of protrusions may be arranged along the longitudinal direction of the resin rib 1.

The shape of the resin bonded to the metal base 2 is not limited to the shape (linear shape) of the resin rib 1 shown in FIGS. 1 to 5. In another example, the resin bonded to the metal base 2 may be spread in a plane shape along the surface of the metal base 2.

As will be described later, a dissimilar material joined portion in which a resin rib is joined to one surface of a metal base is usually used to reinforce a lattice portion of a rectangular cover plate, a side plate, and a bottom plate constituting a housing for accommodating electronic components. Meanwhile, it is preferable that the dissimilar material joined portion in which the resin ribs are joined to both surfaces of the metal base is used to reinforce a peripheral portion of each plate, but the invention is not limited to this embodiment.

A depth of the groove structure varies depending on the thickness of the metal base, and in a case where the thickness of the metal base is in a range of 0.2 mm to 1 mm, the depth thereof is usually 0.1 mm to 10 mm, preferably 0.5 mm to 5 mm, and more preferably approximately 1 mm to 3 mm. In a case where the depth is in a range of 0.1 mm to 10 mm, warpage of the dissimilar material joint can be effectively prevented, and the effect of preventing deformation in a case where an external force is applied is excellent.

The resin may or may not be embedded in a channel portion of the groove having an inverted V-shaped cross section formed on the metal base 2, that is, the surface on the side where the resin rib 1 is not joined. FIG. 1 is a schematic view showing an embodiment in which a resin 1" is embedded in a channel of a groove, and FIG. 2 is a schematic view of an embodiment in which a resin is not embedded in a channel of a groove. In a case where resin is embedded in the channel of the groove, the effect of reducing the weight of a housing for accommodating electronic components is damaged, but it is preferable since mechanical strength (warpage preventing effect and the like) of the housing is increased, and it leads to an improvement in the appearance and design of the housing. In order to further improve the appearance, the metal surface after embedding the resin may be subjected to a coating treatment. In a case where the resin rib 1 is integrally joined to the surface of the metal base 2 having an inverted V-shaped cross section by a method such as an injection molding method (insert molding) as will be described later, embedding the resin into a groove channel on a rear side surface of the metal at the same time can be easily achieved by slightly changing the molding conditions, and thus, usually, an aspect of embedding the resin 1" also in the channel portion of the groove is preferably used.

Figure 6:
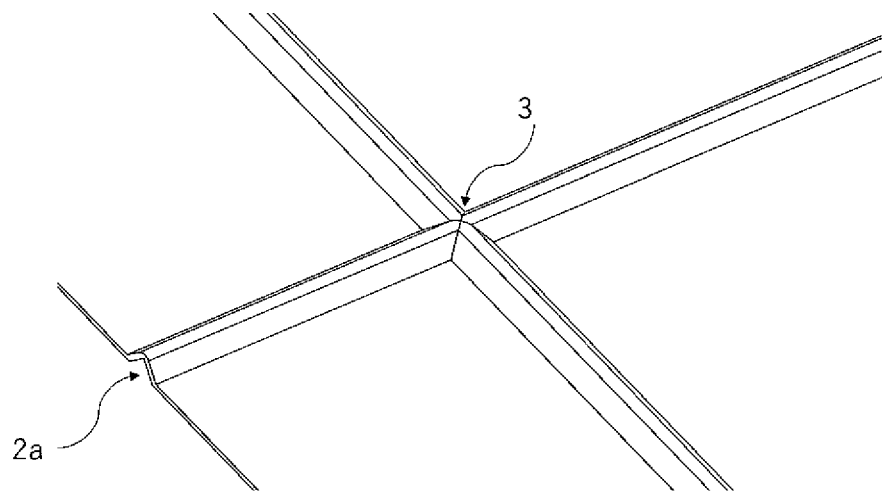
FIG. 6 is an enlarged perspective view of a vicinity of an intersection of two orthogonal inverted V-shaped grooves formed on the surface of a metal base.

In the embodiment, the resin ribs 1 joined onto the metal base 2 include points that intersect each other. Specifically, for example, in a case of a cover plate of the housing for accommodating electronic components shown in FIG. 7, the number thereof is 6 at the peripheral edge and 1 at the intersection located at the center of the metal base 2. The shape of the protrusion of the metal base constituting the intersection of the resin ribs has, for example, a shape of an intersection 3 shown in FIG. 6, and the protrusion having such a structure can be formed by the above-described press working method. The shape of the intersection 3 is not limited to the shape shown in the drawing.

Figure 7:
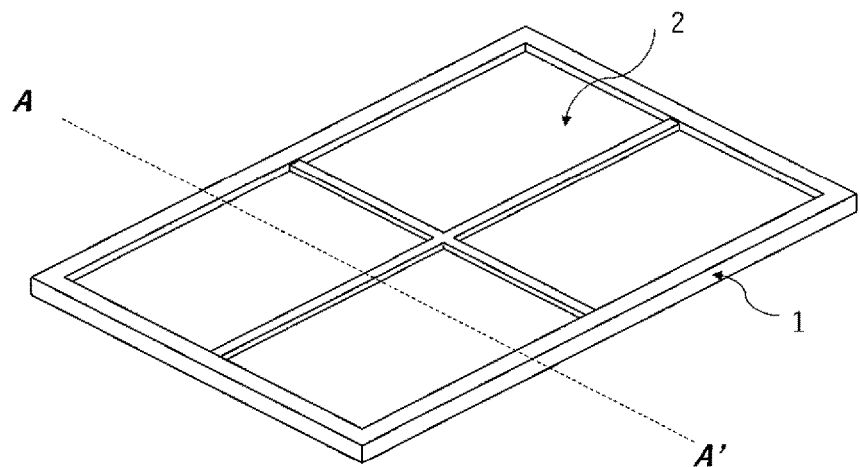
FIG. 7 is a perspective view showing an example of a cover plate of a housing for accommodating electronic components of the embodiment.
Figure 8:
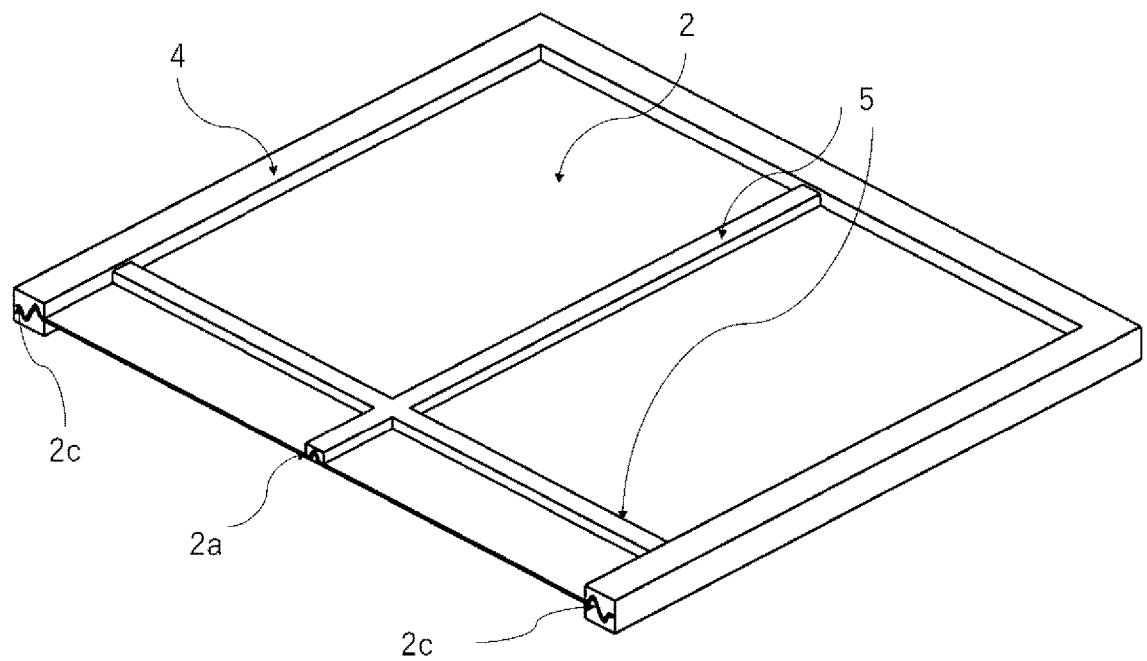
FIG. 8 is a schematic view of a cross section of the cover plate shown in FIG. 7 taken along A-A'.

In the example shown in FIGS. 7 and 8, the resin rib 1 has one portion (resin rib 4) extending along an edge of the metal base 2, and the other portion (resin rib 5) extending in a grid-like shape in a region surrounded by the one portion. As shown in FIG. 8, the resin rib 4 may have the S-shaped groove shown in FIG. 5, and the resin rib 5 may have the inverted V-shaped groove shown in FIG. 2.

Hereinafter, each member constituting the dissimilar material joint according to the embodiment will be described.

<Metal Base>

A metal material constituting the metal base 2 according to the embodiment is not particularly limited, and in a case of being used for a housing for electronic component storage, a metal having electromagnetic wave shielding properties is preferable, and examples thereof include iron, a steel material, stainless steel, aluminum, an aluminum alloy, magnesium, a magnesium alloy, copper, a copper alloy, titanium, titanium alloy, and the like. These may be used alone or in combination of two or more thereof.

Among them, from viewpoints of availability and hardness of the metal base, one or two or more metals selected from iron, stainless steel, an aluminum alloy, a magnesium alloy and a copper alloy are preferable, and from viewpoints of light weight and easy workability, an aluminum alloy and a magnesium alloy are more preferable, and an aluminum alloy is particularly preferable.

The aluminum alloy is not particularly limited, but is an alloy containing aluminum as a main component. Specifically, an alloy of aluminum and at least one metal selected from copper, manganese, silicon, magnesium, zinc, nickel, and the like can be used.

As the aluminum alloy according to the embodiment, aluminum/copper alloys in the 2000s, aluminum/manganese alloys in the 3000s, an aluminum/silicon alloy in the 4000s, aluminum/magnesium alloys in the 5000s, aluminum/magnesium/silicon alloys in the 6000s, aluminum/zinc/magnesium alloys in the 7000s, and aluminum/zinc/magnesium/copper alloys, for four-digit number of the international aluminum alloy names specified in Japanese Industrial Standards (JIS H4140) is preferably used. Among them, the aluminum/magnesium alloys in the 5000s are particularly preferably used from viewpoints of availability and mechanical and thermal properties.

The thickness of the metal base 2 according to the embodiment may be the same at any portion, or may be different depending on portions. An average thickness of the metal base 2 is preferably equal to or more than 0.2 mm and equal to or less than 3.0 mm, more preferably more than 0.2 mm and equal to or less than 2.0 mm, and particularly preferably more than 0.2 mm and equal to or less than 1.0 mm.

In a case where the average thickness of the metal base 2 is equal to or more than the lower limit, the mechanical strength, heat radiation properties, and electromagnetic wave shielding properties of the obtained housing for accommodating electronic components can be further improved.

In a case where the average thickness of the metal base 2 is equal to or less than the above upper limit, the obtained housing for accommodating electronic components can be made lighter. Further, since the average thickness of the metal base 2 is equal to or less than the upper limit, for example, it is easier to bend a boundary between the respective surfaces constituting the metal base 2 in a developed view, and productivity of the housing for accommodating electronic components can be improved.

The shape of the metal base 2 is preferably plate. The metal base 2 formed by processing the metal material into a predetermined shape by a well-known method such as plastic working by cutting, pressing or the like, punching, and thickness reduction working such as cutting, polishing, or electric discharge machining, and then, performing a roughening process which will be described later, is preferable. In summary, it is preferable to use the metal base processed into a required shape by various processing methods.

On the surface of the joined portion between the metal base 2 and the resin rib 1, for example, a fine ruggedness structure in which protrusions having an interval period of equal to or more than 5 nm or and equal to or lower than 500 μm are erected is formed. The resin has intruded into the fine ruggedness structure.

Here, the interval period of the fine ruggedness structure is an average value of a distance from a protrusion to an adjacent protrusion, and can be obtained by using an image captured with an electron microscope or a laser microscope, or a surface roughness measuring device.

The interval period measured by an electron microscope or a laser microscope is usually an interval period of less than 500 nm, and specifically, the surface of the joined portion of the metal base 2 is imaged. From the image, 50 arbitrary protrusions are selected, and the distance from each of the protrusions to the adjacent protrusion is measured. The interval period is obtained by integrating all the distances from the protrusion to the adjacent protrusion and dividing it by 50. Meanwhile, the interval period more than 500 nm is usually obtained by using a surface roughness measuring device.

In general, not only the surface of the joined portion of the metal base 2, but also the entire surface of the metal base 2 is subjected to the surface roughening treatment, and thus the interval period can also be measured from a portion other than the joint surface of the same surface or opposite surface of the surface of the joined portion of the metal base 2.

The interval period is preferably equal to or more than 10 nm and equal to or less than 300 μm, more preferably equal to or more than 20 nm and equal to or less than 200 μm.

In a case where the interval period is equal to or more than the lower limit, a thermoplastic resin composition (A) constituting the resin rib 1 can sufficiently intrude into a recess of the fine ruggedness structure, and it is possible to further improve bonding strength between the metal base 2 and the resin rib 1. In addition, in a case where the interval period is equal to or less than the upper limit, it is possible to prevent a gap from being formed at a joined portion between the metal base 2 and the resin rib 1. As a result, it is possible to prevent the intrusion of impurities such as moisture from the gap between the metal-resin interface. Therefore, in a case where a housing for accommodating electronic components 100 is used at a high temperature and high humidity, it is possible to prevent hardness reduction or warpage caused by molding shrinkage.

As a method for forming the fine ruggedness structure having the above-mentioned interval period, a method for immersing the metal base 2 in an aqueous solution of an inorganic base containing NaOH or the like and/or an aqueous solution of an inorganic acid containing HCl, $HNO_3$, or the like; a method for treating the metal base 2 by an anodic oxidation method; a method for forming ruggedness on the surface of the metal base 2 by pressing a mold punch having ruggedness produced by mechanical cutting, for example, diamond abrasive grain grinding or blasting, or a method for forming the ruggedness shape on the surface of the metal base 2 by sand blasting, knurling, or laser processing; and a method for immersing the metal base 2 in one or more aqueous solutions selected from hydrated hydrazine, ammonia, and a water-soluble amine compound as disclosed in WO2009/31632 are used. These methods can be properly used according to the type of the metal material forming the metal base 2 and the ruggedness shape formed within a range of the interval period. In the embodiment, the method for immersing the metal base 2 in an aqueous solution of an inorganic base containing NaOH or the like and/or an aqueous solution of an inorganic acid containing HCl, $HNO_3$, or the like is preferable, since the treatment can be performed over a wide range of the metal base 2 and the bonding strength between the metal base 2 and the resin rib 1 is excellent.

The method for forming the fine ruggedness structure having the above-mentioned interval period is not particularly limited, and for example, a method for roughening a metal surface disclosed in WO 2015/008847 can also be used.

<Resin Rib>

The resin rib 1 according to the embodiment is a molded body of the thermoplastic resin composition (A), and preferably an injection molded body thereof. The thermoplastic resin composition (A) contains a thermoplastic resin (P1) as an essential component, and further contains other compounding agents (P2) as necessary. In this specification, for convenience, the thermoplastic resin composition (A) is described as including a system composed of only the thermoplastic resin (P1).

(Thermoplastic Resin (P1))

The thermoplastic resin (P1) is not particularly limited, and examples thereof include a polyolefin-based resin, a (meth) acrylic-based resin such as a poly (meth) acrylate methyl resin, a polystyrene resin, a polyvinyl alcohol-polyvinyl chloride copolymer resin, a polyvinyl acetal resin, a polyvinyl butyral resin, a polyvinyl formal resin, a polymethyl pentene resin, a maleic anhydride-styrene copolymer resin, a polycarbonate resin, a polyphenylene ether resin, a polyether ether ketone resin, aromatic polyether ketone such as a polyether ketone resin, a polyester-based resin, a polyamide-based resin, a polyamide imide resin, a polyimide resin, a polyether imide resin, a styrene-based elastomer, a polyolefin-based elastomer, a polyurethane-based elastomer, a polyester-based elastomer, a polyamide-based elastomer, an ionomer, an amino polyacrylamide resin, an isobutylene maleic anhydride copolymer, ABS, ACS, AES, AS, ASA, MBS, an ethylene-vinyl chloride copolymer, an ethylene-vinyl acetate copolymer, an ethylene-vinyl acetate-vinyl chloride graft polymer, an ethylene-vinyl alcohol copolymer, a chlorinated polyvinyl chloride resin, a chlorinated polyethylene resin, a chlorinated polypropylene resin, a carboxyvinyl polymer, a ketone resin, an amorphous copolyester resin, a norbornene resin, fluoroplastic, a polytetra fluoroethylene resin, a fluorinated ethylene polypropylene resin, PFA, a polychlorofluoroethylene resin, an ethylene tetrafluoroethylene copolymer, a polyvinylidene fluoride resin, a polyvinyl fluoride resin, a polyarylate resin, a thermoplastic polyimide resin, a polyvinylidene chloride resin, a polyvinyl chloride resin, a polyvinyl acetate resin, a polysulfone resin, a polyparamethylstyrene resin, a polyallylamine resin, a polyvinyl ether resin, a polyphenylene oxide resin, a polyphenylene sulfide (PPS) resin, a polymethylpentene resin, oligoester acrylate, an xylene resin, a maleic acid resin, a polyhydroxy butyrate resin, a polysulfone resin, a polylactic acid resin, a polyglutamic acid resin, a polycaprolactone resin, a polyethersulfone resin, a polyacrylonitrile resin, a styrene-acrylonitrile copolymer resin, an acrylonitrile-butadiene-styrene copolymer resin, a polyacetal resin, and the like. These thermoplastic resins may be used alone or in combination of two or more thereof.

Among these, from a viewpoint of effectively exhibiting the effect of improving the bonding strength between the metal base 2 and the resin rib 1, one or more thermoplastic resins selected from a polyolefin-based resin, a polyester-based resins, a polyamide-based resin, a polyphenylene sulfide resin, a polycarbonate resin, a polyether ether ketone resin, a polyether ketone resin, a polyimide resin, a polyether sulfone resin, a polystyrene resin, a polyacrylonitrile resin, a styrene-acrylonitrile copolymer resin, an acrylonitrile-butadiene-styrene copolymer resin, a (meth)acrylic-based resin, and a polyacetal resin is preferably used. Preferably, one or more thermoplastic resins selected from a polyolefin-based resin, a polyester-based resin, a polyamide-based resin, and a polyphenylene sulfide resin is used, because the mechanical strength, warpage resistance, lightness, EMI resistance, and heat radiation properties of the housing for accommodating electronic components are well balanced.

(Other Compounding Agents (P2))

The thermoplastic resin composition (A) may contain other compounding agent (P2) for imparting individual functions. Examples of the other compounding agents (P2) include a filler (F1), and an additive (F2) selected from a flame retardant, a flame retardant aid, a heat stabilizer, an antioxidant, a pigment, a weathering agent, a plasticizer, a dispersant, a lubricant, a release agent, an antistatic agent, and an impact resistance modifying agent.

In the embodiment, the resin rib 1 preferably further includes the filler (F1), from a viewpoint of adjusting the difference in linear expansion coefficient between the metal base 2 and the resin rib 1 or improving the mechanical strength of the resin rib 1.

As the filler (F1), for example, one or two or more from the group consisting of hydrotalcites, metal nitrides such as boron nitride, metal oxides such as aluminum oxide, metal hydroxides such as aluminum hydroxide, metal carbides such as boron carbide, metal carbonates such as magnesium carbonate, glass fibers, carbon fibers, metal fibers, organic fibers, carbon particles, clay, talc, silica, minerals, and cellulose fibers can be selected. Among these, from viewpoints of linear expansion preventing properties, electrical insulation properties, heat radiation properties, and mechanical strength (including warpage resistance), one or two or more selected from hydrotalcites, glass fibers, metal nitrides, talc, and minerals are preferable.

The shape of the filler (F1) is not particularly limited, and may be any shape such as a fiber shape, a particle shape, and a plate shape.

In a case where the resin rib 1 contains the filler (F1), a content thereof is, for example, equal to or more than 5 mass % and equal to or less than 95 mass %, preferably equal to or more than 10 mass % and equal to or less than 90 mass %, more preferably equal to or more than 20 mass % and equal to or less than 90 mass %, even more preferably equal to or more than 30 mass % and equal to or less than 90 mass %, and particularly preferably equal to or more than 50 mass %, and equal to or less than 90 mass %, in a case where the entire resin rib 1 is 100 mass %.

In the embodiment, in order to impart various functions, the thermoplastic resin composition (A) may contain the additive (F2) selected from a flame retardant, a flame retardant aid, a heat stabilizer, an antioxidant, a pigment, a weathering agent, a plasticizer, a dispersant, a lubricant, a release agent, an antistatic agent, and an impact resistance modifier. A total amount of the additive (F2) in the thermoplastic resin composition (A) is, for example, equal to or less than 10 mass %, preferably 0.01 to 5 mass %, more preferably approximately 0.1 to 2 mass %.

(Production Method of Thermoplastic Resin Composition (A))

The method for producing the thermoplastic resin composition (A) is not particularly limited, and can be produced by a generally well-known method. For example, the following method can be used. First, the thermoplastic resin (P1) and, if necessary, other compounding agents (P2) are mixed or melt-mixed by using a mixing device such as a Banbury mixer, a single-screw extruder, a twin-screw extruder, or a high-speed twin-screw extruder, and accordingly, the thermoplastic resin composition (A) is obtained.

<Production Method for Housing for Accommodating Electronic Components>

Next, a method for manufacturing the housing for accommodating electronic components according to the embodiment will be described.

Figure 9:
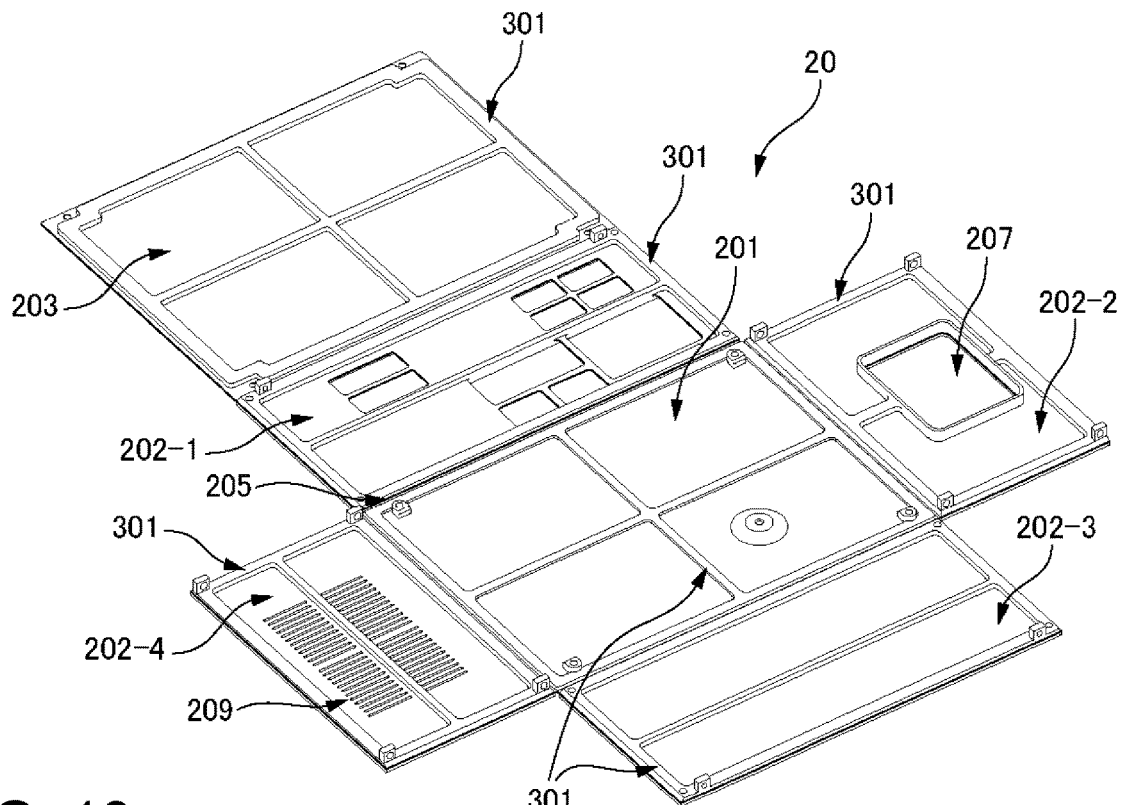
FIG. 9 is a perspective view showing an example of a developed dissimilar material joint to which resin ribs of the embodiment are joined.

FIG. 9 schematically showed an example of a structure of a developed metal plate (developed dissimilar material joint) to which a resin rib 301 of the embodiment according to the invention is bonded. That is, in the example shown in FIG. 9, the dissimilar material joint has a developed planar structure in which the housing for accommodating electronic components is developed.

The method for producing the housing for accommodating electronic components according to the embodiment includes, for example, the following steps (a) to (c).

(a) A step of preparing a developed metal plate including a metal bottom plate 201, and a metal side plate 202 (202-1, 202-2, 202-3, and 202-4) integrally connected to the metal bottom plate 201, and having a fine ruggedness structure on at least a joined portion surface to which the resin rib 301 is joined.

(b) A step of producing a developed dissimilar material joint 20 by installing the developed metal plate in a die, injecting the thermoplastic resin composition (A) into the die, and bonding a resin rib 301 to a surface of the developed metal plate.

(c) A step of bending a boundary line portion 205 between the bottom plate 201 and the side plate 202 of the developed dissimilar material joint 20 to make the developed dissimilar material joint 20 into a box shape.

The manufacturing method of the housing for accommodating electronic components according to the embodiment is advantageous from a viewpoint of improving storage efficiency or transporting efficiency of a large amount of intermediate components, since the shape of the developed metal plate or the developed dissimilar material joint 20 which is the intermediate product before bending is flat plate shape.

(Step (a))

First, the developed metal plate including the metal bottom plate 201, and the metal side plate 202 (202-1, 202-2, 202-3, and 202-4) integrally connected to the metal bottom plate 201, and having a fine ruggedness structure on at least a joined portion surface to which the resin rib 301 is joined, is prepared. An opening 207 is formed on the side plate 202-2, and a slit 209 is formed on the side plate 202-4.

Here, the developed metal plate corresponds to the metal base 2 constituting the housing for accommodating electronic components, and can be obtained by performing a roughening treatment disclosed in WO 2015/008847 to at least the surface of the joined portion to which the resin rib 301 is joined. The resin rib 301 corresponds to the resin rib 1 shown in FIGS. 1 to 5 and 7.

Details of the metal base 2 and the roughening treatment will not be repeated.

(Step (b))

Next, the developed metal plate is placed in a die, the thermoplastic resin composition (A) is injected into the die, and the resin rib 301 is joined to the surface of the developed metal plate.

Examples of the method for joining the resin ribs 301 include an injection molding method (insert molding method), a transfer molding method, a compression molding method, a reaction injection molding method, a blow molding method, a thermoforming method, a press molding method, and the like. Among these, the injection molding method is preferred. That is, the resin rib 301 is preferably an injection molded body.

(Step (c))

Next, the boundary line portion 205 between the bottom plate 201 and the side plate 202 is bent to form the dissimilar material joint 20 into a box shape, thereby obtaining the housing for accommodating electronic components.

The method for forming the developed dissimilar material joint 20 in a box shape is not particularly limited, and a generally well-known method can be used. For example, the housing for accommodating electronic components can be obtained by bending a boundary line portion 205 between the bottom plate 201 and the side plate 202 and attaching a cover plate 203, as necessary.

At this time, the adjacent side plates 202 and the cover plate 203 connected to the side plates 202 as necessary may be engaged with each other with mechanical means. The mechanical engagement means is not particularly limited, but includes screwing and the like.

The dissimilar material joint of the invention can be widely applied to, in addition to the housing for accommodating electronic components, a support of a back door or a bumper of a vehicle, which are required to have high strength and rigidity, a support of a heat exchanger and a blower, front and rear parts of a car, door thresholds, office machine support frames, and decorative parts.

Although the embodiments of the invention have been described above, these are merely examples of the invention, and various configurations other than the above can be used.

EXAMPLES

Figure 10:
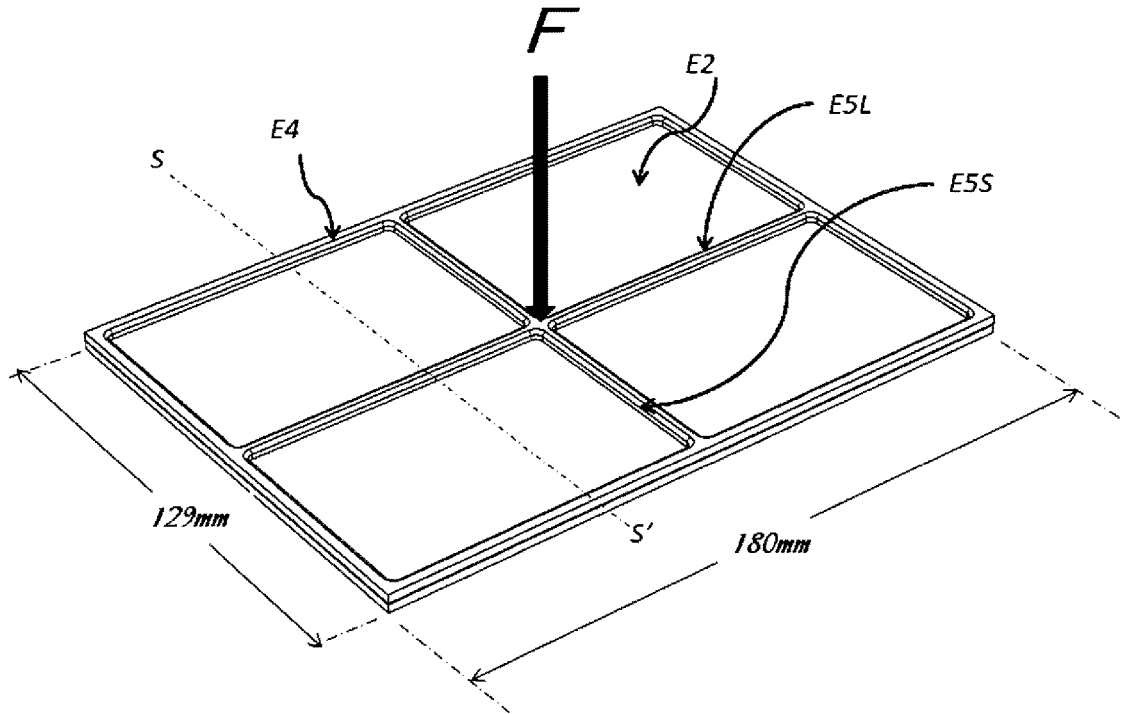
FIG. 10 is a perspective view of a dissimilar material joint used in examples.
Figure 11:
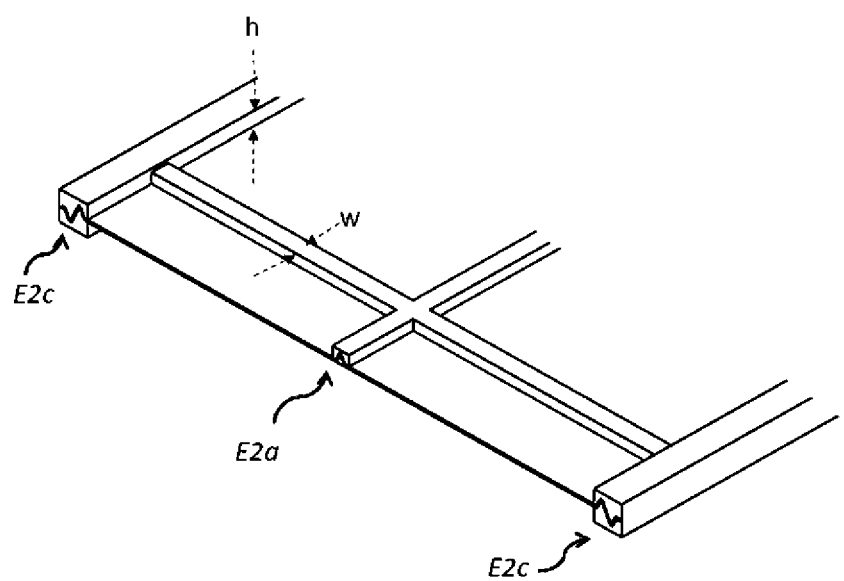
FIG. 11 is an S-S' cross-sectional view of a dissimilar material joint used in examples.

Hereinafter, the embodiment will be described in detail with reference to examples and comparative examples. The embodiment is not limited to the description of these examples. FIGS. 10 and 11 are used as drawings for describing the examples.

Example 1

In the Example 1, a metal base was set as an aluminum alloy plate, a double-sided resin rib E4 was joined to both surfaces of an S-shaped groove E2c formed on the entire periphery of the metal base, a single-sided resin rib E5L was joined to one surface (upper surface side in FIG. 10) of an inverted V-shaped groove E2a formed along the longitudinal direction of the metal base at the center other than the periphery, and a single-sided resin rib E5S was joined to one surface (upper surface side in FIG. 10) of the inverted V-shaped groove E2a formed along the short direction of the metal base at the center other than the periphery. Regarding the dissimilar material joint obtained by doing so, a deformation amount due to the applied stress was obtained.

(Production of Roughened Aluminum Alloy Plate)

An aluminum alloy plate having a shape of 180 mm (long)×129 mm (short)×0.3 mm (thickness) (alloy number 5052 standardized based on JIS H4000) was prepared. Next, an S-shaped groove was formed on the entire periphery of the aluminum alloy plate, and an inverted V-shaped groove was formed at the center (longitudinal direction and short direction) by a press machine. The aluminum alloy plate is provided with a plurality of small holes for resin intrusion so that the resin can flow from a fixed side (cavity side) to a movable side (core side).

Next, the above-mentioned aluminum alloy plate was degreased using a commercially available degreaser, immersed in one treatment tank filled with an alkali-based etching solution (30° C.) containing 15 mass % of sodium hydroxide and 3 mass % of zinc oxide for 3 minutes (in the following description, it may be abbreviated as "alkali-based etching solution treatment"), then immersed in 30 mass % of nitric acid (30° C.) for 1 minute, and the alkali-based etching solution treatment was repeated once. Next, the obtained aluminum alloy plate was immersed and vibrated in another treatment tank filled with an acid-based etching aqueous solution containing 3.9 mass % of ferric chloride, 0.2 mass % of cupric chloride, and 4.1 mass % of sulfuric acid at 30° C. for 5 minutes. Next, the aluminum alloy plate was subjected to ultrasonic cleaning (in water for 1 minute) with running water, and then the aluminum alloy plate was dried to obtain a roughened aluminum alloy plate.

An average value of interval periods measured from surface roughness of the obtained roughened aluminum alloy plate by using a surface roughness measuring device "Surfcom 1400D (manufactured by Tokyo Seimitsu Co., Ltd.)" was 143 µm.

(Production of Dissimilar Material Joint by Insert Molding)

A dedicated metal insert die was mounted to an injection molding machine (JSW J400AD110H) manufactured by Japan Steel Works, Ltd., and the roughened aluminum alloy plate obtained by the above method was set in the die. Then, as a thermoplastic resin composition in the die, glass fiber reinforced polypropylene (V7100 manufactured by Prime Polymer Co., Ltd., 80 parts by mass of polypropylene (230° C., MFR of 2.16 kg load=18 g/10 min), 20 parts by mass of glass fiber) was subjected to injection molding under the conditions of a cylinder temperature of 230° C., a mold temperature of 55° C., an injection speed of 100 mm/sec, a holding pressure of 15 MPa, holding time of 5 seconds, and a cooling time of 50 seconds, to produce a dissimilar material joint. In the dissimilar material joint, the thermoplastic resin member is joined to the peripheral portion of the roughened aluminum alloy plate so as to face both surfaces to form the resin rib E4, and joined to only one surface (upper surface side of FIG. 10) of the center other than the peripheral portion to form resin ribs (E5L and E5S). A width (w) of the resin rib formed by doing so was 3. 6 mm in common, and a height (h) of the resin rib was 2.1 mm in common.

(Measurement of Displacement Amount)

A displacement amount in a case where an external force of 10 N in a vertical direction was applied to the center portion of the dissimilar material joint (reference numeral F in FIG. 10) was measured (25° C.) by using a bending deflection measuring device autograph manufactured by Shimadzu Corporation, was 1.1 mm.

Example 2

In the Example 2, double-sided resin ribs (E4) were joined to both surfaces of the S-shaped groove E2c formed on the entire peripheral portion of the aluminum alloy plate used in Example 1, and the single-sided resin rib (E5L) was joined to one surface (the upper surface side in FIG. 10) of the inverted V-shaped groove E2a formed in the longitudinal direction in the center portion other than the peripheral portion. A single-sided resin rib (E5S) was joined in the short direction in the center portion without forming a groove structure. Regarding the dissimilar material joint obtained by doing so, a deformation amount due to the applied stress was obtained.

(Production of Roughened Aluminum Alloy Plate)

The alloy plate exactly the same as the aluminum alloy plate used in Example 1 was prepared. Next, an S-shaped groove was formed on the entire periphery of the aluminum alloy plate, and an inverted V-shaped groove was formed only in an inner longitudinal direction of the central portion, by using a press machine. The aluminum alloy plate is provided with a plurality of small holes for resin intrusion so that the resin can flow from a fixed side (cavity side) to a movable side (core side).

Next, the aluminum alloy plate was subjected to chemical liquid etching in exactly the same manner as the roughening method described in Example 1 to produce a roughened aluminum alloy plate.

An average value of interval periods measured from surface roughness of the obtained roughened aluminum alloy plate by using a surface roughness measuring device "Surfcom 1400D (manufactured by Tokyo Seimitsu Co., Ltd.)" was 143 µm.

(Production of Dissimilar Material Joint By Insert Molding)

A dedicated metal insert die was mounted to an injection molding machine (JSW J400AD110H) manufactured by Japan Steel Works, Ltd., and the roughened aluminum alloy plate obtained by the above method was set in the die. Next, injection molding was performed in exactly the same manner as described in Example 1 to produce a dissimilar material joint. In the dissimilar material joint, the thermoplastic resin member is joined to the roughened aluminum alloy plate at the peripheral portion so as to face both surfaces to form a resin rib (E4), and joined to only one surface (upper side in FIG. 10) of the central portion other than the peripheral portion to form the resin ribs (E5L and E5S). A width (w) of the resin rib formed by doing so was 3.6 mm in common, and a height (h) of the resin rib was 2.1 mm in common.

(Measurement of Displacement Amount)

A displacement amount in a case where an external force of 10 N in a vertical direction was applied to the center portion of the dissimilar material joint (reference numeral F in FIG. 10) was measured (25° C.) by using a bending deflection measuring device autograph manufactured by Shimadzu Corporation, was 1.3 mm.

Comparative Example

In a comparative example, no groove structure was formed on the peripheral portion and the center of the aluminum alloy plate used in Example 1, the resin ribs (E4) were joined to both surfaces at the peripheral portion, the resin rib (E5L) was joined to one surface along the longitudinal direction of the center, and the resin rib (E5S) was joined to one surface along the short direction of the center. Regarding the dissimilar material joint obtained by doing so, a deformation amount due to the applied stress was obtained.

(Production of Roughened Aluminum Alloy Plate)

An aluminum alloy base (alloy number 5052 standardized based on JIS H4000) was cut to prepare an aluminum alloy plate having a shape of 180 mm (horizontal width)×129 mm (longitudinal width)×0.3 mm (thickness). Next, the aluminum alloy plate was subjected to chemical liquid etching in exactly the same manner as the roughening method described in Example 1 to produce a roughened aluminum alloy plate.

An average value of interval periods measured from surface roughness of the obtained roughened aluminum alloy plate by using a surface roughness measuring device "Surfcom 1400D (manufactured by Tokyo Seimitsu Co., Ltd.)" was 143 µm.

(Production of Dissimilar Material Joint by Insert Molding)

A dedicated metal insert die was mounted to an injection molding machine (JSW J400AD110H) manufactured by Japan Steel Works, Ltd., and the roughened aluminum alloy plate obtained by the above method was set in the die. Next, injection molding was performed in exactly the same manner as described in Example 1 to produce a dissimilar material joint. In the dissimilar material joint, the thermoplastic resin member is joined to the roughened aluminum alloy plate at the peripheral portion so as to face both surfaces to form a resin rib (E4), and joined to only one surface (upper side in FIG. 10) of the central portion other than the peripheral portion to form the resin ribs (E5L and E5S). A width (w) of the resin rib formed by doing so was 3.6 mm in common, and a height (h) of the resin rib was 2.1 mm in common.

(Measurement of Displacement Amount)

A displacement amount in a case where an external force of 10 N in a vertical direction was applied to the center portion of the dissimilar material joint (reference numeral F in FIG. 10) was measured (25° C.) by using a bending deflection measuring device autograph manufactured by Shimadzu Corporation, was 1.7 mm.

From the comparison between the displacement amount of Example 1, the displacement amount of Example 2, and the displacement amount of Comparative Example, it can be said that the displacement amount is reduced by the groove structure formed in the metal base (aluminum alloy plate).

REFERENCE SIGNS LIST 1 resin rib
1' resin rib
1" resin
2 metal base
2a inverted V-shaped groove
2b V-shaped groove
2c S-shaped groove
3 intersection
4 resin rib
5 resin rib
20 dissimilar material joint
201 bottom plate
202-1 side plate (front plate)
202-2 side plate
202-3 side plate (rear plate)
202-4 side plate
203 cover plate
205 boundary line portion
207 opening
209 slit
301 resin rib
E2 metal base
E4 resin rib (peripheral portion)
E5L resin rib (central longitudinal direction)
E5S resin rib (central short direction)
E2a inverted V-shaped groove
E2c S-shaped groove

The invention claimed is:

1. A dissimilar material joint comprising a resin rib and a metal base,
the metal base includes (a) a first portion, (b) a second portion and a protruded portion between the first portion and the second portion, the protruded portion is formed by bending a portion of the metal base with respect to the first portion and the second portion, the protruded portion protrudes into the resin rib disposed on the protruded portion, wherein at least part of the first portion and at least part of the second portion is not covered by the resin rib, a surface of the protruded portion of the metal base comprises protrusions and a resin of the resin rib intrudes into the protrusions on the surface of the protruded portion of the metal base, and, wherein the protruded portion comprises a groove that extends continuously in a longitudinal direction of the resin rib.

2. The dissimilar material joint according to claim 1, wherein the metal base has a first surface and a second surface opposite to the first surface, the resin rib is disposed on one of the first surface and the second surface of the metal base of the metal base, and the protruded portion includes a single groove having an inverted V-shaped cross section.

3. The dissimilar material joint according to claim 1, wherein the metal base has a first surface and a second surface opposite to the first surface, and a first resin rib is disposed on the first surface of the metal base in the protruded portion and a second resin rib disposed on the second surface of the metal base in the protruded section.

4. The dissimilar material joint according to claim 1, wherein the protruded portion includes two grooves parallel to each other and having an inverted V-shaped cross section and a V-shaped cross section, respectively.

5. The dissimilar material joint according to claim 1, wherein a metal constituting the metal base is one or two or more selected from iron, stainless steel, an aluminum alloy, a magnesium alloy, and a copper alloy.

6. The dissimilar material joint according to claim 1, wherein the resin rib is formed of a thermoplastic resin composition containing a thermoplastic resin and a filler.

7. The dissimilar material joint according to claim 6, wherein the resin rib is formed by injection molding of the thermoplastic resin composition onto the metal base.

8. The dissimilar material joint according to claim 1, in which the dissimilar material joint has a developed planar structure in which a housing for accommodating electronic components is developed.

9. A housing for accommodating electronic components comprising the dissimilar material joint according to claim 1.

10. The dissimilar material joint according to claim 1, wherein the first portion and the second portion are edge portions of the metal base.

11. The dissimilar material joint according to claim 1, wherein the metal base consists of the first portion, the second portion and the protruded portion.

12. The dissimilar material joint according to claim 1, wherein the protrusions have an interval period from 5 nm to 500 μm.

* * * * *